United States Patent [19]

Sonoda

[11] Patent Number: 4,466,692

[45] Date of Patent: Aug. 21, 1984

[54] INTEGRALLY FORMED INSULATOR ASSEMBLY AND METHOD OF MANUFACTURING THE SAME

[75] Inventor: Keiji Sonoda, Hirakata, Japan

[73] Assignee: Nichifu Terminal Industries Co., Ltd., Osaka, Japan

[21] Appl. No.: 520,741

[22] Filed: Aug. 5, 1983

Related U.S. Application Data

[63] Continuation of Ser. No. 239,803, Mar. 2, 1981, abandoned.

[30] Foreign Application Priority Data

Aug. 9, 1980 [JP] Japan .......................... 55-112827[U]
Oct. 2, 1980 [JP] Japan .......................... 55-138494

[51] Int. Cl.³ .......................... B29D 3/00; B65D 73/02
[52] U.S. Cl. .............................. 339/276 SF; 206/330; 264/255
[58] Field of Search ........ 339/218 R, 218 M, 276 SF; 29/883; 264/255, 272.14, 308; 206/330, 343, 390, 820

[56] References Cited

U.S. PATENT DOCUMENTS

| | | | |
|---|---|---|---|
| 2,462,816 | 2/1949 | Schner, Jr. et al. | 206/820 |
| 2,620,008 | 12/1952 | Mallard | 206/820 |
| 2,964,171 | 12/1960 | Chadwick | 339/276 SF |
| 3,192,298 | 6/1965 | Fisher | 264/255 |
| 3,414,123 | 12/1968 | Litt et al. | 206/820 |
| 3,938,657 | 2/1976 | David | 206/343 |
| 4,309,370 | 1/1982 | Sizemore et al. | 264/308 |

FOREIGN PATENT DOCUMENTS

2908797 9/1979 Fed. Rep. of Germany ...... 339/276 SF

*Primary Examiner*—Neil Abrams
*Attorney, Agent, or Firm*—Jordan and Hamburg

[57] ABSTRACT

A method for manufacturing an integrally formed insulator assembly, comprises forming a unit segment of a set overall length including a plurality of insulator sleeves of plastic material disposed parallel to each other at proper intervals and belting web portions between the sleeves. The segment is then fed in a sleeve clamper wherein an electrical connector element is inserted in a respective one of the sleeves and proper external force is applied on the sleeve to clamp up the connector element in proper electrical conduction state. Another segment is similarly formed up and is integrally united with the previous segment at the longitudinal end thereof. Any desired length of the integrally united product is obtained by repeating such extension. Firm unification of the segments is assured by providing proper complementary fitting engagement structure in such mutually united portions.

2 Claims, 15 Drawing Figures

INTEGRALLY FORMED INSULATOR ASSEMBLY AND METHOD OF MANUFACTURING THE SAME

This application is a continuation of application Ser. No. 239,803, filed Mar. 2, 1981 now abandoned.

BACKGROUND OF THE INVENTION (1) Field of the Invention

This invention relates to a method of manufacturing an integrally formed insulator assembly, in which a unit segment of a set overall length is formed to have a preset plurality of insulator sleeves of plastic material disposed in parallel at proper spacing intervals and also interconnected by means of belting web portions. The segment is then fed in a sleeve clamper wherein electrical connector elements are inserted into the sleeves and proper external force is applied on the sleeve to clamp up the connector elements. Another segment is similarly formed up and is integrally united with the previous segment at its longitudinal ends, so that any desired continuous overall length of the integrally united product is obtained by repeating such mold-forming. This invention also relates to such assembly product itself of any desired overall continuous length.

(2) Description of the Prior Art

In manufacturing an integrally formed long insulator assembly, a conventional manner for instance includes the steps of fabricating a lot of individually separate insulator sleeves, juxtaposing at intervals and interconnecting the insulator sleeves by using proper interconnection taping means as has previously been prepared for this purpose. In this method it is difficult to interconnect and securely set such discrete insulator sleeves, which has to be arranged in an identical direction, sense and at proper regular intervals with the interconnection taping means, thus causing poor productivity and incurring high cost. It has indeed been quite a problem in such conventional manufacturing of the assembly product as described above and causes various troubles because of inaccuracies in the intervals and in the postures of the insulation sleeves as are apt to occur.

As a mere idea, it may also be conceivable to manufacture quite a long integral assembly including the insulator sleeves disposed in parallel and equally spaced apart as an integral unity by mold-forming technique. It is possible to manufacture such a long insulator sleeve assembly precisely uniformly by keeping up the proper interval pitch and the posture of the sleeves, which gives the benefit of convenient utilization later. But manufacturing of a long assembly is hardly practical or feasible since the forming of the metal mold and the entire installation annexed thereto must then be of enoumous size and complicated, thus incurring very high installation cost and requiring quite a wide installation space, which all in all makes it utterly uneconomical in view of the production cost.

SUMMARY OF THE INVENTION

In view of the above, this invention has an object to provide a method of manufacturing an insulator assembly of a long ultimate overall length with high precision and quite efficiently, with use simply of an economical mold-forming installation comparatively small in size.

The method according to this invention of manufacturing an integrally formed insulator assembly including a series of sleeves disposed in parallel to each other to serve as electrical connector covering and belting web portions interconnecting the sleeves is characterized by: mold-forming by a split type metal mold, one unit component segment of a preset overall length having a plurality of insulator sleeves of a suitable plastic material adapted to receive therein electrical connector elements for defomation under exertion of proper external force to thus clamp up the elements in proper electrical connection in use, and belting web portions of the plastic material integrally interconnecting the sleeves at predetermined intervals in such a state that the sleeves are juxtaposed in parallel to one another for receiving the connector element from one side to be arranged identically, each segment having a first interconnection belting web portion protruding from one longitudinal end and a second interconnection belting web portion protruding from the other end; mold-forming another identical component segment such that the first interconnection belting web portion of the former segment is situated in the mold to be connected or integrally formed with the second interconnection belting web portion of the latter for engagement with each other when molded, thus to integrally uniting together both said mutually engaged interconnection belting web portions during the mold-forming, resulting in integral formation of such two segments in longitudinal direction successively; and successively repeating such mold-forming until the assembly of any desired continuous overall length is ultimately provided.

Thus, the long and desired length assembly having the insulator sleeves and the belting web portions for interconnecting them is not manufactured in a single forming operation, but each mold-forming operation is done actually for manufacturing the ultimate long assembly product by integrally connecting one unit component segment of a preset overall length to another segment during the next successive mold-forming operation and consecutively repeating the mold-forming until the desired overall length is attained. Therefore the forming of the metal mold is simple and small in size and yet the product of any desired overall length may ultimately be freely obtained. The latter segment is here mold-formed while simultaneously the already formed former segment is integrally connected thereto, which operation is consecutively repeated. No separate operational steps particularly for the integral unification of such consecutive segments with each other, apart from the mold-forming operations, are needed. Thus it is simply required to repeat such mold-forming operations as mentioned hereinabove, and it has now been made possible to very efficiently manufacture a high-precision and high-quality insulator assembly of the desired overall length, practically without any inaccuracies in the spacing intervals and in the postures of the insulator sleeves.

With respect to the conventional product, insulator assembly manufactured according to the method as mentioned above, it is feared that there might be a risk of causing some trouble as being apt to occur, since interconnection of the adjacent segments with each other relies upon unification of the interconnection belting web portions at their mutually abutting ends. The unification portions are not inherently integral with respect to the belting web portions for interconnecting the insulator sleeves longitudinally in each component segment. Therefore the unification portions might accidentally be deformed or even ruptured while the product assembly of the desired length is in storage in the overlappingly rolled up state, in transfer for the clamping operation or in some other stage, because of insufficient unification strength of such portions. For instance in a normal abutting condition the unification of such interconnection belting web portions would have been effected to deform.

In view hereof, this invention has as its another object to enhance to a sufficient degree the unification strength of the unification portions, in which the unification of the mating interconnection belting web portions of one segment to another segment takes place simultaneously with the mold-forming of the another segment. Consequently the mutual configuration of both the interconnection belting web portions may freely be designed in any complicated shape without thereby affecting the production efficiency.

Thus the product according to this invention is an integrally formed insulator assembly comprising a series of sleeves disposed in parallel to serve as electrical connector coverings and belting web portions for interconnecting the sleeves, which are made up of unit component segments each successively being made up by the mold forming in a set overall length having a plurality of the insulator sleeves made of a suitable plastic material, and a plurality of belting web portions made of a plastic material for connecting the insulator sleeves. Each insulator sleeve is adapted to receive therein an electrical connector element and to then be deformed under exertion of proper external force to thus clamp up the element with a proper electrical wire the belting web portions for integrally interconnecting the sleeves at predetermined intervals are situated that the sleeves are equally juxtaposed in parallel to one another for insertion of the connector elements from a particular side, each of such segments having a first interconnection belting web portion integrally protruding from one longitudinal end and a second interconnection belting web portion integrally protruding from the other end. The first interconnection belting web portion of one segment and the second interconnection belting web portion of another segment can be integrally united together when the another segment is mold-formed, thus to result in integral unification of both segments. First mating engagement means is provided in the first and second interconnection belting web portions, ultimately to be integrally united together during the mold forming as mentioned hereinbefore.

By thus providing the first mating engagement means for engagement of the first and second interconnection belting web portions, it has a good advantage that the unification of the interconnection belting web portions of two segments takes place simultaneously with the mold-forming of the latter segment. Consequently the mutual configuration of both the interconnection belting web portions may freely be designed in any complicated shape without thereby any particular difficulty in the mold-forming. As has already been mentioned hereinbefore, unification strength of the interconnection belting web portions integrally connected together can sufficiently be enhanced despite the adjacent segments united together simply by the unification of their web portions with each other, so that it is possible to obtain the long product excellent to sustain no trouble, for instance accidental rupture of the unification portions while in transfer of the product.

Further, if second mating engagement means is additionally provided in the interconnection belting web portions for mutual engagement in various directions different one another, namely in the longitudinal and breadthwise directions of the long belting, it is then possible to further enhance the unification strength of the interconnection belting web portions by the combined effect of such first and second mating engagement means.

Still other objects and advantages of this invention will become apparent from the detailed description to follow hereunder.

BRIEF DESCRIPTION OF THE DRAWINGS

The drawings show, by way of example, some embodiments of the insulator assembly and how they are manufactured according to this invention, wherein.

DESCRIPTION OF THE PREFERRED EMBODIMENTS

Figure 1:
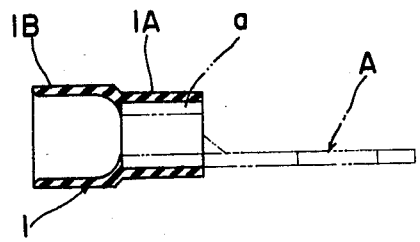
FIGS. 1 and 2 show vertical section views of an insulator sleeve illustrating an electric terminal before and after the terminal is clamped, respectively.
Figure 2:
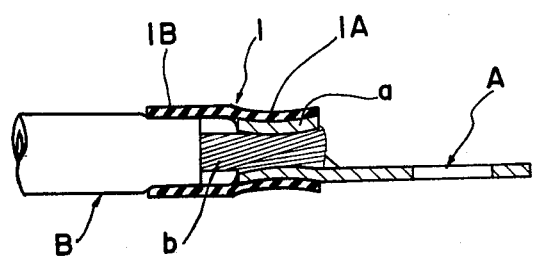
Figure 3:
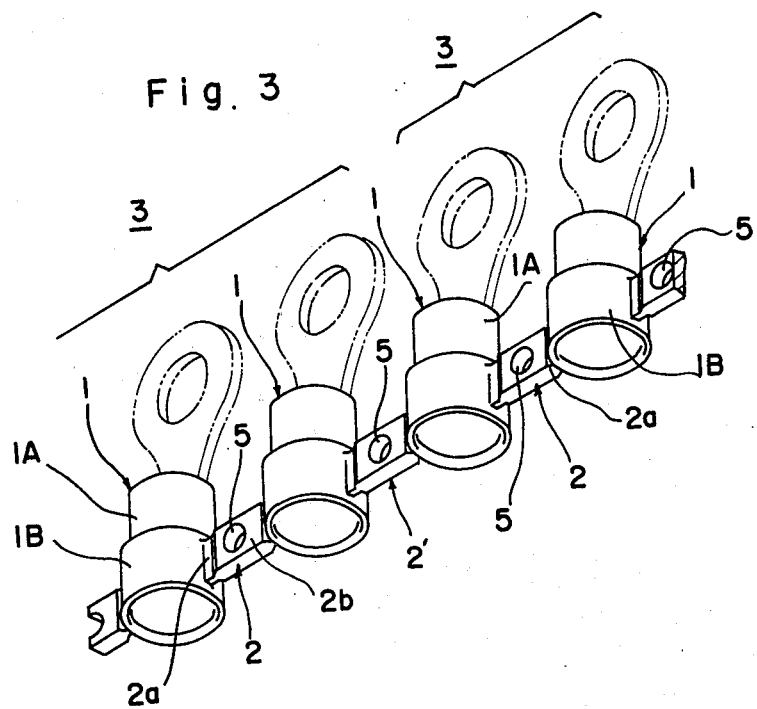
FIG. 3 is a perspective view of the insulator assembly.
Figure 4:
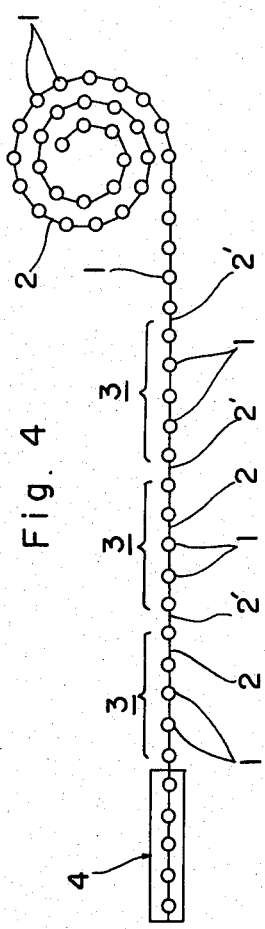
FIG. 4 is a side elevation view showing how the product is manufactured.
Figure 5:
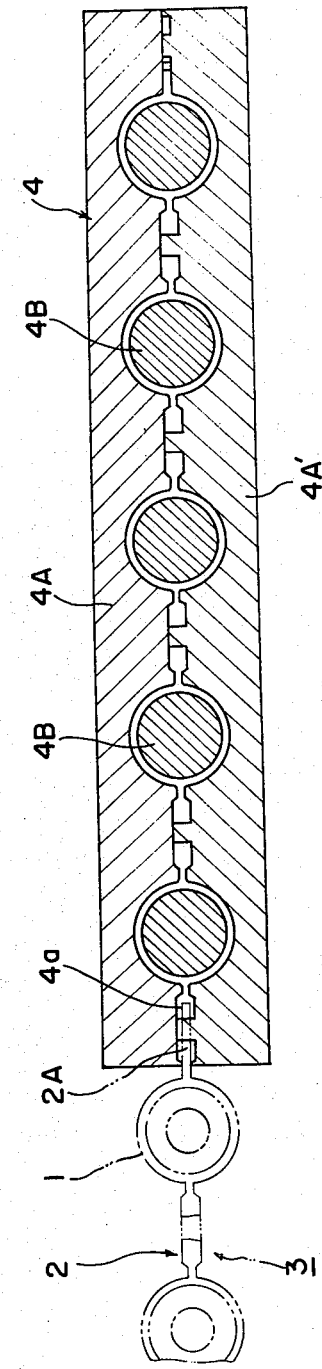
FIG. 5 is a sectional view, in an enlarged scale, of a metal mold assembly to be used for manufacturing the product.

The product according to this invention as shown in FIGS. 1-3 is an insulator assembly of long overall length, with a multiplicity of insulator sleeves (1) of plastic material juxtaposed at proper intervals, the entire assembly being made for rolling up overlappingly as shown schematically in FIG. 4. Each sleeve (1) has on one end thereof a small diameter tubular portion (1A) adapted to holdingly receive a tubular stem portion (a) of a clampable terminal piece (A) (illustrated as a specific example of an electrical connector element), as inserted thereinto from the one end side. The sleeve has on the other end thereof a enlarged diameter tubular portion (1B) adapted to receive an electrical wire end portion (B) as inserted thereinto from the other end side with bare tip end portion (b) of the wire, which is at first stripped of the insulation covering and then properly inserted within the tubular stem portion (a). Therefore, after insertion of the members (A) and (B) into the sleeve, when external mechanical force is exerted on the small diameter tubular portion (1A) as to press the small diameter tubular portion (1A), the sleeve (1) may then clamp up the terminal piece (A) the wire end portion (B) for proper electrical conduction therebetween. Manufacture of this product may follow the method as follows:

First, a mold for forming a unit component segment (3) in a preset length is prepared. The segment (3) includes a plurality of the insulator sleeves (1) and belting web portions (2) which are made of plastic material integrally interconnecting the sleeves are integrally connected by the belting web portions at proper regular intervals at the enlarged diameter tubular portions (1B) thereof. The connector-element insertion ends are equally kept in parallel with one another. A split-type metal mold (4) to be used therefor, as schematically shown in FIG. 5, comprises a pair of metal mold elements (4A), (4A') for outer shape forming, which can be freely mounted together and separated apart in the thickness direction of the belting web portions, and a metal core unit (4B) for inner shape forming, which can be freely inserted into and retracted from between the pair of metal mold elements (4A), (4A'). The unit segment (3) formed as stated above and separated from the metal mold (4), is then engaged to the metal mold (4) in such a manner that an interconnection belting web portion (2A) provided at one longitudinal end of the segment is inserted into and held in an end of a molding cavity (4a) corresponding to an interconnection belting web portion (2B) to be formed at the other longitudinal end of another similar unit segment (3) when it is actually formed. Upon such preparation, mold-forming of such next unit segment (3) is actually performed, so that the interconnection web portion (2B) thereof is integrally united to the interconnection web portion (2A) of the previously mold-formed unit segment (3), resulting therefore in hereby providing an insulator sleeve assembly of the overall length of the two unit segments. By consecutively repeating such mold-forming operations, a long insulator sleeve assembly of any desired continuous overall length made of a plurality of the unit segments (3), may be provided.

The belting web portions (2) as formed by such mold-forming are made, as shown in FIG. 3, to have their portions serving as joints for the insulator sleeves (1). Joint roots (2a) of the belting web portions (2) is thinner in thickness so that the rolling up of the product (3) is enabled by bending deformation of such portions. A thicker or normal proper portion (2b) of each of the belting web portions (2), a registering engagement through hold (5) to serve as means for continual transfer.

Figure 6:
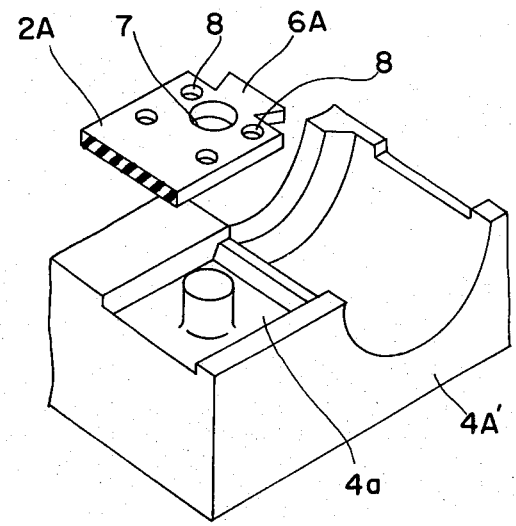
FIG. 6 is a perspective view of the essential portion of the metal mold assembly.
Figure 7:
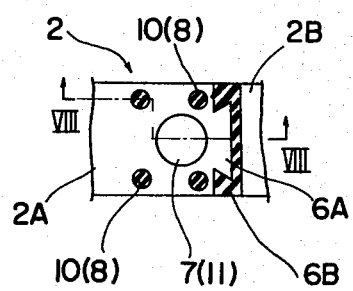
FIG. 7 is a plan view of interconnecting portions of two segments taken along line VII—VII in FIG. 8.
Figure 8:
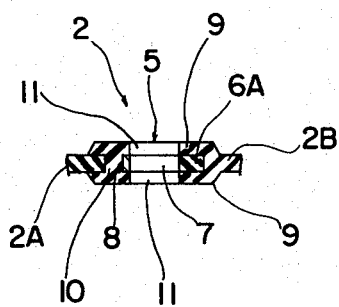
FIG. 8 is a sectional view taken along line VIII—VIII in FIG. 7.

The mutually mating interconnection belting web portions, hereinafter referred to as first and second interconnection belting web portions (2A) and (2B) at longitudinal ends of each unit segment, respectively, are formed by mold-forming as shown in FIGS. 6–8. The first interconnection belting web portion (2A) is flat and has thickness as in the thinner joint root portion (2a) of each intermediate belting web portion (2). The first portion (2A) has a tip end protrusion (in dove-tail shape) (6A), a larger diameter through hole (7) and four smaller diameter through holes (8) formed in the intermediary portion thereof. The second interconnection belting web portion (2B) is subsequently mold-formed to substantially enntirely embed the first portion (2A) of the previously formed segment as held therein. The protrusion (6A) of the former segment is tightly embedded in the mating complementary engagement portion (6B) of the second interconnection belting web portion (2B) of the later-formed segment to be securely hampered from segregation in any direction. Such functional unit including the mutually engaging portions (6A) and (6B) complementary with each other may arbitrarily be referred to as second mating engagement means.

The mold-forming of the second interconnection belting web portion (2B) integrally receiving therein the previously formed first web portion (2A) is so made as to provide a belting web portion (2'), as shown in FIG. 3, which is identical in shape and also in size with the belting web portions (2) even with respect to the registering engagement through hole (5) formed therein. As is apparent, such an integral mold-forming results in providing the second interconnection belting web portion (2B) having the interconnecting portion of the previously formed first web portion (2A) between opposed planar portions (9),(9). The planar portions are integrally interconnected by complementary engagement (cylindrical) columns (10) which are formed by tightly filling up with plastic material in the smaller diameter through holes (8) of the previously formed first web portion (2A), thus to prevent segregation in the longitudinal and in the breadthwise directions. The opposed planar portions (9),(9) are formed to have through holes (11),(11) adapted to be registered with the larger diameter through hole (7) in the first web portion (2A) and thus to provide the registering engagement through hole (5). Such functional unit including the small diameter through holes (8) and columns (10), mutually engaging as complementary with each other, may arbitrarily be referred to as first mating engagement means.

Features of the particular embodiments of this invention as recited hereabove may again be recited in summary, together with the specific advantages accruing therefrom, as follows:

(1) Mutually engaging interconnection belting web portions of the two successively mold-formed unit segments are integrally united each other, with the interconnection belting web portions being constructed to have mutually engaging protrusions and complementary recesses, respectively. The interconnection belting web portions between the adjacent unit segments can hereby be made. Although the belting web portions are formed simply by uniting together such web portions to each other, they have the unification strength substantially the same as that of the intermediate belting web portions as are formed inherently integral with the insulator sleeves, thus to surely prevent the risk such as an accidental rupture of the interconnection belting web portions between the adjacent unit segments while in transfer of the ultimate long product.

(2) In each intermediate belting web portion of the unit segment and also in each integrated interconnection belting web portion between the adjacent segments there are provided a respective registering engagement portions for proper continual transfer. Transfer of the ultimate long product for forwarding same, so as to properly feed and set the insulator sleeves to the respective stations or locations for effecting the clamping, can hereby be made surely, accurately and smoothly without any slipping.

(3) Each integrated interconnection belting web portion between the adjacent segments is made identical in shape and also in size with each intermediate belting web portion of the unit segment. The ultimate long product is hereby made to have the insulator sleeves at precise regular intervals throughout the entire length thereof, thus to stabilize the transfer of the product.

Figure 9:
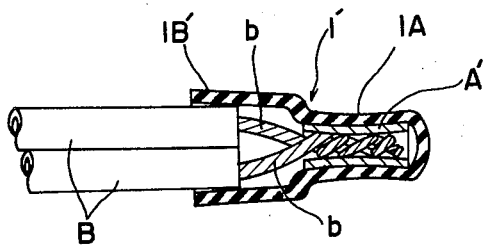
FIGS. 9 and 10 show vertical section views illustrating the respective modifications of the insulator sleeve.
Figure 10:
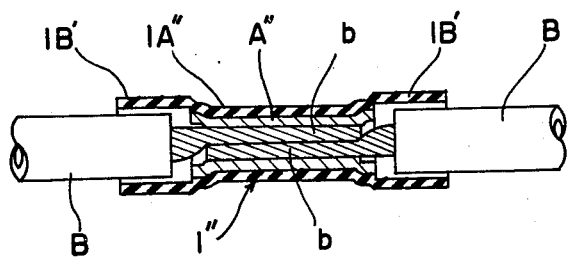

The insulator sleeves manufactured according to this invention are not restricted in their shape to the one specific embodiment as illustrated in FIGS. 1-3, but may as well be freely modified, for instance as illustrated in FIGS. 9 and 10, respectively, for which short description is given as follows:

Shown in FIG. 9 is an insulator sleeve (1') which has a small diameter open-mouth tubular portion (1A) with a bottom adapted to holdingly receive a tubular member (A') and a large diameter tubular portion (1B') integrally formed with the tubular portion (1A) and adapted to receive the two electrical wire end portions (B),(B). The bare tip end portions (b),(b) are held in the tubular member (A') and are disposed in the tubular portion (1A) for clamping. The wire end portions (B)(B) are held in the tubular portion (1B'). FIG. 10 shows an insulator sleeve (1") which has a small diameter tubular portion (1A") adapted to holdingly receive a tubular member (A") and larger diameter tubular portions (1B'),(1B') integrally formed with the small diameter tubular portion (1A") at both ends adapted to receive the two electrical wire end portions (B),(B) as inserted from the respective ends. The bare tip end portions (b),(b) inserted from the tubular portions (1B'),(1B') are held in the tubular member (A") located inside the tubular portion (1A") for clamping. The insulator sleeves (1'),(1") serve for clamping up the wire ends (b),(b) together with the respective tubular member (A'),(A") by exerting proper external force on the respective small diameter tubular portions (1A'),(1A") to crash down the same.

Figure 11:
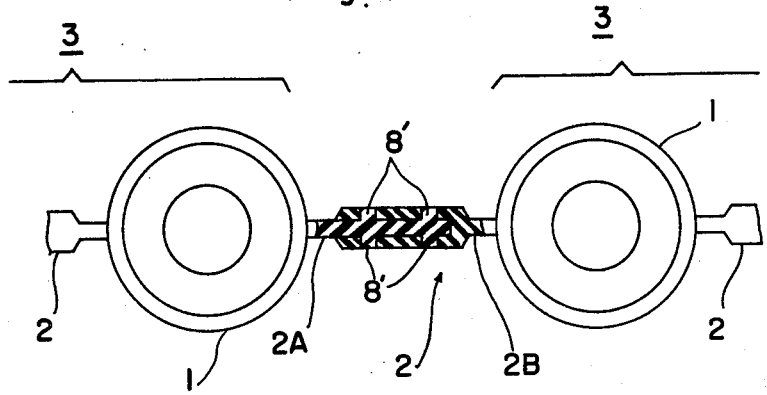
FIG. 11 is a side elevation view partly in section of the insulator assembly having the interconnection belting web portions in a modified structure.
Figure 12:
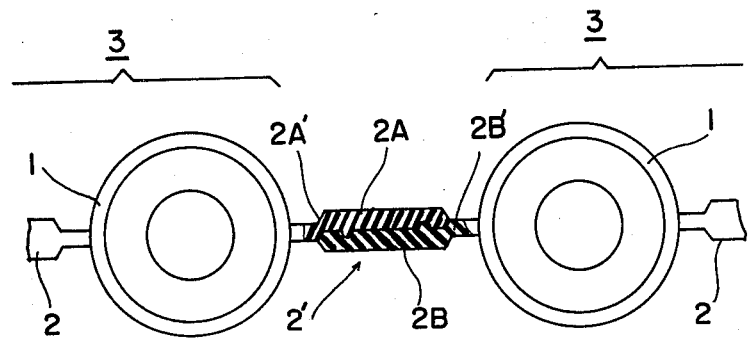
FIG. 12 is a similar side elevation view of the insulator assembly having the interconnection belting web portions in another modified structure.
Figure 13:
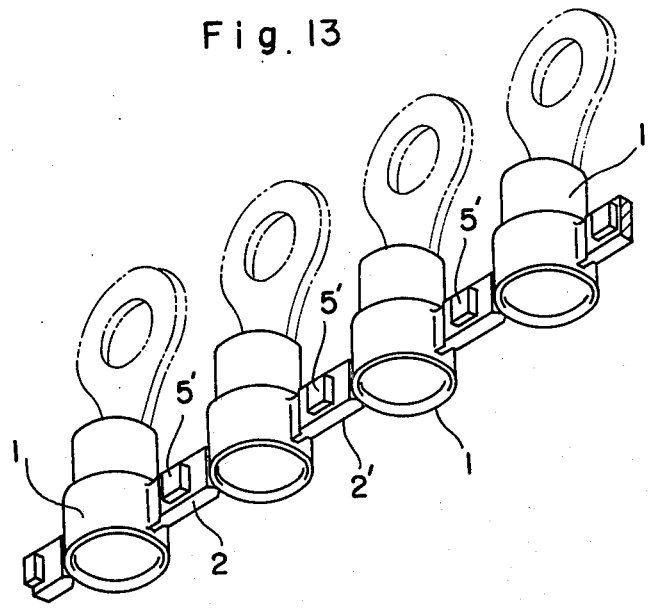
FIG. 13 is a perspective view of the insulator assembly having the interconnection belting web portions in still another modified structure.

Likewise, the belting web portions manufactured according to this invention are also not restricted in their structure to the embodiments as illustrated in FIGS. 3 and 5-8 but may as well be freely modified, for instance as illustrated in FIGS. 11-13, respectively, for which short description is given as follows:

Shown in FIG. 11 is a modification of the first interconnection belting web portion (2A) of the unit segment, which has protrusions (8') contrary to the embodiment shown in FIGS. 5-8 including the through holes (8) as have previously been described and illustrated. Shown in FIG. 12 is a still another modification of the first interconnection belting web portion (2A) of the unit segment, which has an offset stepped portion (2A') to be integrated with the mating second interconnection belting web portion (2B), similarly having an offset stepped portion (2B'). When the unit segment is later formed, the stepped portions (2A'),(2B') overlap and engage with each other. Another modification of the belting web portions (2') as well is shown in FIG. 13. The another modification shown in FIG. 13 has a registering engagement protrusion (5') for proper continual transfer, contrary to the web portion shown in FIGS. 3 and 5-8 formed to have a registering engagement through hole (5).

To be noted here is that it is not the indispensable requirement, according to the type of the sleeve clamping crasher as is actually used, to provide the registering engagement through hole (5) or protrusion (5') for proper continual transfer. Provision of such through hole (5) or protrusion (5') may thus be omitted for instance by providing in its stead any proper chucking transfer device in the clamping crasher, as can securely engage either with the small diameter tubular portion (1A),(1A'), or (1A") or with the large diameter tubular portion (1B),(1B'), or (1B") of the insulator sleeve (1).

Figure 14:
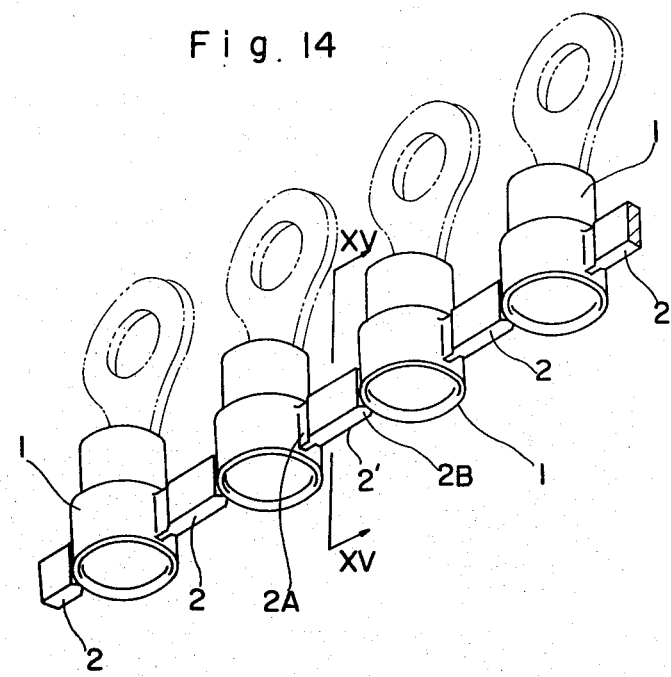
FIG. 14 is a perspective view of another insulator assembly.
Figure 15:
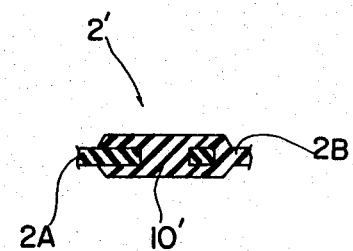
FIG. 15 is a sectional view taken along a line XV—XV in FIG. 14.

FIGS. 14 and 15 show another embodiment of the insulator assembly. The web portion (2') has no hole (5) as shown in FIG. 3. Transportation of this insulator assembly to a clamping machine may, therefore, be carried out by wheel-like transfer means which engages with the insulator sleeves (1),(1). A connecting portion (10') is formed in the transverse direction of the web portion (2B) and connects one insulator assembly to another to resist against a tension force in longitudinal direction of this assembly. Other constructions of this assembly is substantially the same as that of the first embodiment.

I claim:

1. An integrally formed insulator assembly comprising a series of sleeves disposed parallel to each other to serve as electrical connector coverings and belting web portions interconnecting the sleeves, said insulator assembly being formed of unit component segments, each unit component segment being successively made up by mold forming to have a certain overall length and including a plurality of the insulator sleeves made of a suitable plastic material adapted to receive therein electrical connector elements respectively so that the connector elements can be deformed under exertion of proper external force for clamping up the connector elements with proper electrical conducting material, and the belting web portions made of the plastic material integrally interconnected with the sleeves at certain intervals so that the sleeves are identically juxtaposed in parallel to one another for insertion of the connector element from a particular side properly, each segment having a first interconnection belting web portion integrally formed therewith to protrude at one longitudinal end and a second interconnection belting web portion integrally formed to protrude at the other end, said first interconnection belting web portion of one segment and the second interconnection belting web portion of another segment being integrally united together when said another segment is molded to thereby integrally connect both segments in longitudinal direction thereof, said first interconnecting belting web portion having first mating engagement means in the form of a flat and thin plate with at least one opening, and said second interconnecting belting web portion having second mating engagement means in the form of two flat and thin plates parallel to each other with at least one connecting portion between the two parallel plates so that when the succeeding unit component segment is integrally connected to the preceding unit component segment, the first mating engagement means in the form of a flat and thin plate is formed between the parallel plates of the second mating engagement means and integrally connected therewith to thereby constitute inter-locking of the first and second mating engagement means in which the connecting portion between the two parallel plates is located in the opening of the first mating engagement means.

2. An integrally formed insulator assembly comprising a series of sleeves disposed parallel to each other to serve as electrical connector coverings and belting web portions interconnecting the sleeves, said insulator assembly being formed of unit component segments, each unit component segment being successively made up by mold forming to have a certain overall length and including a plurality of the insulator sleeves made of a suitable plastic material adapted to receive therein electrical connector elements respectively so that the connector elements can be deformed under exertion of proper external force for clamping up the connector elements with proper electrical conducting material, and the belting web portions made of the plastic material integrally interconnected with the sleeves at certain intervals so that the sleeves are identically juxtaposed in parallel to one another for insertion of the connector element from a particular side properly, each segment having a first interconnection belting web portion integrally formed therewith to protrude at one longitudinal end and a second interconnection belting web portion integrally formed to protrude at the other end, said first interconnection belting web portion of one segment and the second interconnection belting web portion of another segment being integrally united together when said another segment is molded to thereby integrally connect both segments in longitudinal direction thereof, said first interconnecting belting web portion having first mating engagement means in the form of a flat and thin plate with at least one opening, and said second interconnecting belting web portion having second mating engagement means in the form of two flat and thin plates parallel to each other with at least one connecting portion between the two parallel plates so that when the succeeding unit component segment is integrally connected to the preceding unit component segment, the first mating engagement means in the form of a flat and thin plate is formed between the parallel plates of the second mating engagement means and integrally connected therewith to thereby constitute inter-locking of the first and second mating engagement means in which the connecting portion between the two parallel plates is located in the opening of the first mating engagement means, each belting web portion between the sleeves in one component segment as well as each belting web portion formed by integrally connecting the first and second interconnection belting web portions of two component segments including at longitudinal ends adjacent to the sleeves joint root portions less thick than the remaining web portions so that the assembly may be rolled up in the longitudinal direction thereof by resilient bending of such joint root portions between the respective adjacent sleeves.

* * * * *